United States Patent [19]
Chaplik

[11] Patent Number: 5,617,063
[45] Date of Patent: Apr. 1, 1997

[54] MATCHED FILTERS FOR PROCESSING RELATED SIGNAL COMPONENTS

[75] Inventor: Naom Chaplik, San Diego, Calif.

[73] Assignee: Pacific Communication Sciences, Inc., San Diego, Calif.

[21] Appl. No.: 571,596

[22] Filed: Dec. 13, 1995

[51] Int. Cl.$^6$ ............ H03C 3/00; H04L 27/12; H04L 27/20; H04L 27/36
[52] U.S. Cl. .......... 332/103; 327/558; 332/100; 332/123; 375/298; 375/296; 455/110
[58] Field of Search ............ 332/100, 103–105, 332/159, 161, 167, 170, 117, 123; 327/552–559; 329/308, 309, 356, 357; 331/12; 375/296, 298, 300, 301, 308; 455/108–110, 214, 337

[56] References Cited

U.S. PATENT DOCUMENTS 3,259,692  7/1966  Aspinwall .............. 332/170 X
4,086,536  4/1978  Acker .................. 332/170 X

FOREIGN PATENT DOCUMENTS 0001657  3/1986  WIPO .................. 327/556

OTHER PUBLICATIONS

Bainter, J.R.; "Active Filter Has Stable Notch, And Response Can Be Regulated"; *Electronics;* Oct. 2, 1975; pp. 115–117.

Primary Examiner—David Mis
Attorney, Agent, or Firm—Martin J. Jaquez; Merle W. Richman, III

[57] ABSTRACT

A circuit for processing related signal components, such as in-phase and quadrature signal components generated within a modulator, in which a first filter and a second filter are matched such that the gain of each such filter is nearly identical. A modulator is provided having matched filters in accordance with the present invention in which the gain "K" of each filter is equal to 1. By using a filter which has a gain of 1, the gain is removed from consideration when attempting to match the filter response of one filter to another. Furthermore, each filter is relatively simple to implement, having only four resistors, two capacitors, and two operational amplifiers.

12 Claims, 3 Drawing Sheets

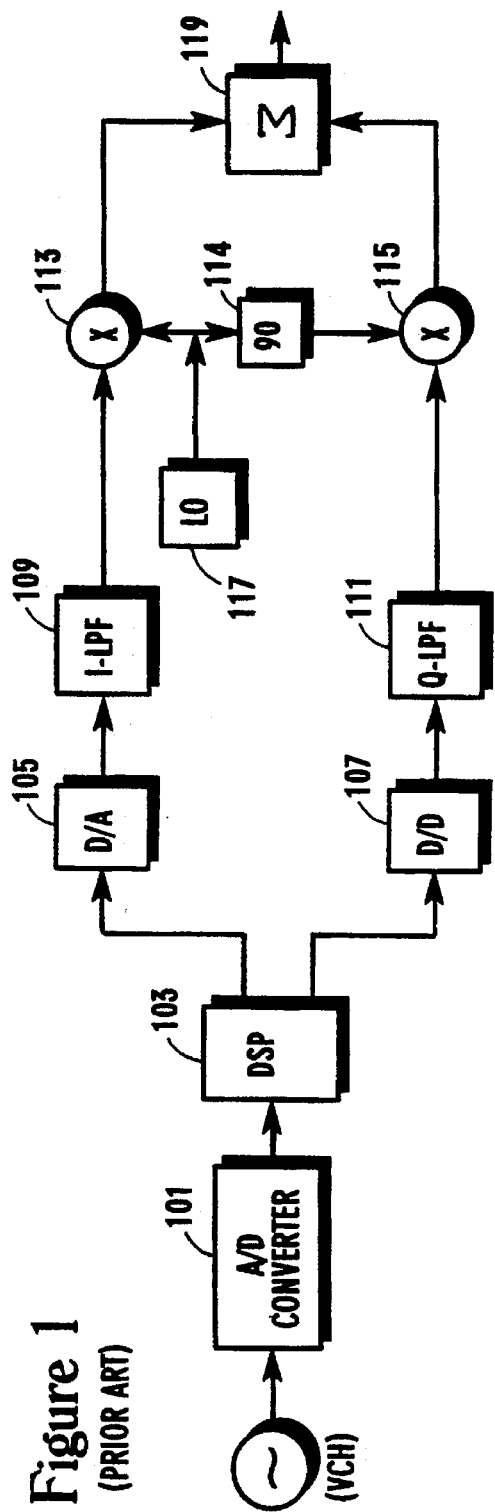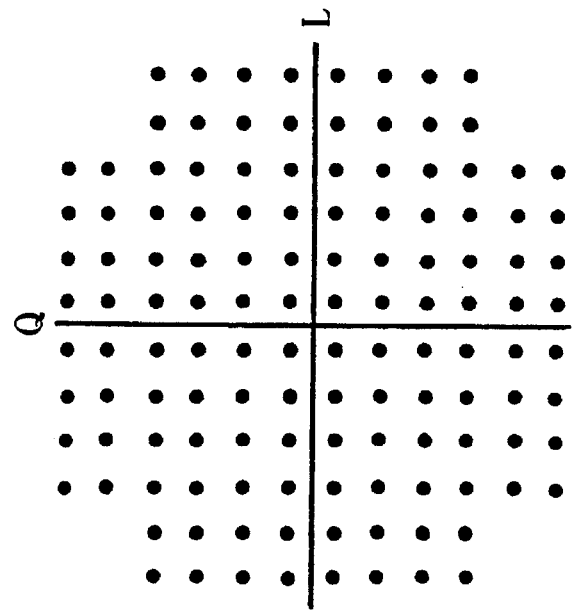
Figure 1 (PRIOR ART)
FIGURE 2 (PRIOR ART)

MATCHED FILTERS FOR PROCESSING RELATED SIGNAL COMPONENTS

BACKGROUND OF THE INVENTION

1. Field of the Invention

This Invention relates to a method and apparatus for processing electronic signals, and more particularly to matched active filters which have essentially identical average gain.

2. Description of Related Art

In communications systems, information must be encoded in a manner which allows the information to be transmitted from a first location to a second location. For example, transmitters, such as radio stations, commonly transmit FM (frequency modulation) signals. In accordance with frequency modulation techniques, the amplitude of the carrier is essentially constant and the frequency of the carrier varies about the carrier center frequency in proportion to the amplitude of the baseband signal.

In accordance with one method for frequency modulating information upon a carrier, two signals are generated and modulated with the information which is to be communicated. The first such signal (the in-phase or "I component") is identical to the second such signal (the quadrature or "Q component"), with a 90° phase difference between the I and Q components. These two signals are then summed. For example, a baseband signal V(t) is modulated onto a carrier by generating an I and Q component and summing these two signals as follows:

$$V_0 \text{ Sin } [V(t)] + V_0 \text{ Cos}[V(t)]$$

One circuit for generating this modulated carrier is shown in block diagram form in FIG. 1. In accordance with the method implemented by this circuit, the analog baseband signal V(t) is applied to an analog-to-digital (A/D) converter 101. The output from the A/D converter 101 is a digital signal which has been sampled at a predetermined sampling rate which is at least twice the highest frequency expected to be encountered in the baseband signal. Each sample is represented by a digital value which indicates the average amplitude of the baseband signal over the sample time. This digital signal is then applied to a digital signal processor (DSP) 103 which generates the two components: $V_0$ Sin [V(t)] (referred to as the in-phase component of the carrier) and $V_0$ Cos [V(t)] (referred to as the quadrature component of the carrier). These two components are then each coupled to a digital-to-analog (D/A) converter 105, 107. The output from each D/A converter 105, 107 is an analog signal which includes quantization noise. Quantization noise is the inaccuracy of the conversions between analog and digital representations which result from the fact that the number of bits in the digital representation of each sample are not infinitely great. This quantization noise is minimized by coupling the output from each D/A converter to an associated conventional analog low pass filter 109, 111, such as an eliptical filter, which has a pair of imaginary zeros at the frequency of the quantization noise.

In addition to the quantization noise, the analog signal which is reconstructed from the samples in the D/A converter will include high frequency components due to the fact that the number of samples is not infinite. Each quantization filter 109, 111 is typically a low pass filter, since the quantization noise and the high frequency component of the analog signal output from the D/A converter will appear as a frequency which is above the sampling rate. In most cases, these analog filters must be fabricated using discrete components. The output from each quantization filter 109, 111 is coupled to a mixer 113, 115 which completes the modulation of the signals and converts the signal to an intermediate frequency (IF). The IF output may then be converted to a radio frequency (RF) signal which is suitable for broadcasting. A local oscillator (LO) 117, provides an LO signal by which the I and Q signals are multiplied in the mixers 113, 115. A 90° phase shifter 120 is provided between the LO 117 and the mixer 115. The output from each mixer 113, 115 is then coupled to a summing circuit 119. The output of the summing circuit 119 is then transmitted.

In accordance with another method for modulating a carrier, digital information is encoded onto the carrier by altering both the amplitude and the phase of the carrier. In accordance with one such method for encoding information referred to as quadrature amplitude modulation (QAM), the carrier is a composite signal which includes a first signal at the carrier frequency (i.e., the I component), and a second signal at the carrier frequency which is shifted in phase 90° from the I component (i.e., the Q component). The relative amplitude of each of the components of the carrier may be either positive or negative and may be any of a predetermined fixed values. Negative amplitudes represent a 180° phase shift from the positive amplitude. Each pair of amplitude values represent a point on a QAM plot, mad also represents a particular digital symbol. FIG. 2 is an illustration of a QAM plot having 16 points which may be represented by each component of the carrier being modulated with one of four amplitude values.

In both the circuit shown in FIG. 1, and a circuit which performs QAM modulation, the amplitude of the I and Q components must be generated without any distortion in the amplitude relationship between the two components. That is, if the amplitude of the I and Q components are processed by components of the system (such as filters) the value of the amplitude of each component is not critical, since the values of the I and Q components may be scaled. However, the relative amplitude of the I component to the Q component must be preserved or the relative position of the symbols which were encoded onto the carrier will be altered. With this in mind, it is clear that in-phase signal filters and quadrature signal filters (such as the low pass filters, each with a notch or imaginary zero) which are commonly used to remove undesirable frequency components from the I and Q components after these components have been generated must have very nearly the same amplitude response as the carrier frequency. It will also be clear to those skilled in the art that a wide variety of other situations exist in which the amplitude relationship between two signals must be preserved after filtering with a low pass filter having a notch.

The requirement that the gain of the quadrature component filter and the in-phase component filter be matched poses a significant challenge to the engineer tasked with designing such filters. Low pass filters having imaginary zeros typically have a frequency response which is commonly described in terms of a transfer function using a parameter "S", which is equal to $2\pi\omega$, where $\omega$ is frequency in radians. A typical expression representing the transfer function of a low pass filter having a notch is:

$$K \cdot (b_2 \cdot S^2 + 1)/(a_2 \cdot S^2 + a_1 \cdot S + 1)$$

It will be understood by those skilled in the art that when $b_2 \cdot S^2 = -1$, the transfer function goes to zero (i.e., the value of S for which this is true is a "zero" for that filter). Thus, for any input, the output is zero. This results in a notch at the frequency at which S has a value which satisfies the condition $b_2 \cdot S^2 = -1$. When attempting to match two such filters for use in a modulator, the constants, a, b, and K within the first filter must match the corresponding constants within the second filter as closely as possible. The value K is hereafter referred to as the "gain" of the filter. Each of the other constants, a, b, and c control the shape of the filter response. Quite obviously, if the values of each of these constants are identical, then the transfer functions for the two filters will be identical. While it is desirable to equate each these constants, the most critical constant in the transfer function is the gain K, since this constant has an impact on the entire transfer function.

One example of a low pass filter having imaginary zeros is illustrated in the schematic present in FIG. 3. The gain K for the filter of FIG. 3 is:

$$(R_3 \cdot R_{10})/(R_4 \cdot R_8) - (R_{10}/R_9)$$

Clearly, the tolerance of each of the components $R_3$, $R_4$, $R_5$, $R_8$, $R_9$, and $R_{10}$ will control how nearly equal the frequency response of two such filters can be made. Due to the relatively large number of resistors upon which the constant K depends, it would be difficult to provide two filters with transfer functions that are sufficiently similar. That is, each of the resistors in each of the filters would have to be a precision resistance in order to conform that resistor to the corresponding resistor of the other filter and thus match the frequency response of the two filters. Precision resistors are expensive and add to the expense of producing such a pair of filters.

FIG. 3 is a schematic of another filter in which the gain K of the transfer function is far less dependent upon the values of individual components within the filter circuit. However, the gain K is nonetheless dependent upon two resistances, the ratio of which must be equal in the two filters. FIG. 4, is a schematic of yet another example of a filter which might be used in the paths of the in-phase and quadrature components of a demodulator. Once again, the gain K of the transfer function of the filter shown in FIG. 4 is dependent upon the ratio of two resistors.

It should be clear that a number of situations require matched filters, including designing modulators. Therefore, it would be desirable to have matched filters in which the gain of each filter is equal to the gain of the other. The present invention provides such a matched pair of filters.

SUMMARY OF THE INVENTION

The present invention is a circuit comprising two low pass filters having imaginary zeros or notches (such as eliptical filters) in which the gain of each filter is independent of the values or characteristics of any of the components used in the filter, thereby allowing the gain of each filter to be equal. In accordance with one embodiment of the present invention, related signal components, such as in-phase and quadrature signal components generated within a modulator, are applied to a corresponding one of the filters. In accordance with one embodiment of the present invention, a modulator is provided having matched filters in accordance with the present invention in which the gain "K" of each filter is equal to 1 and independent of the values or characteristics of any of the components used in the filter.

By using a filter which has a gain that is independent of the values or characteristics of any of the components of the filter, the gain is removed from consideration when attempting to match the filter response of one filter to another.

Furthermore, in accordance with one embodiment of the present invention, each filter is relatively simple to implement, having only four resistors, two capacitors, and two operational amplifiers.

Each of the matched filters of the present invention have a first integrator, the input of which is coupled to an information signal generator. The output the first integrator is coupled to the input of a second integrator. A feedback path sums the output of the second integrator with the input to the first integrator. The output from the summing circuit is applied as positive feedback to the first integrator and is taken as the output from the filter. This configuration results in a filter which has a gain of 1, independent of the values or characteristics of any of the circuit elements used to form the filter. Therefore, the gain of two or more such filters will be equal.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

FIG. 1 is a block diagram of a conventional modulator using I and Q components.

FIG. 2 is an illustration of a QAM plot.

Like reference numbers and designations in the various drawings refer to like elements.

DETAILED DESCRIPTION OF THE INVENTION

Throughout this description, the preferred embodiment and examples shown should be considered as exemplars, rather than as limitations on the present invention.

The present invention is a circuit including at least two matched filters, each filter having a notch (i.e., imaginary zeros) at a predetermined frequency, used to provide low pass filtering to related signal components, such as the in-phase and quadrature components which are generated in the process of frequency modulating a signal in accordance with the well known conventional I and Q modulation technique. The present invention may be used in any system which requires, or in which it would be desirable to have, low pass filters which have a notch (such as eliptical filters) and which have identical gain.

Figure 3:
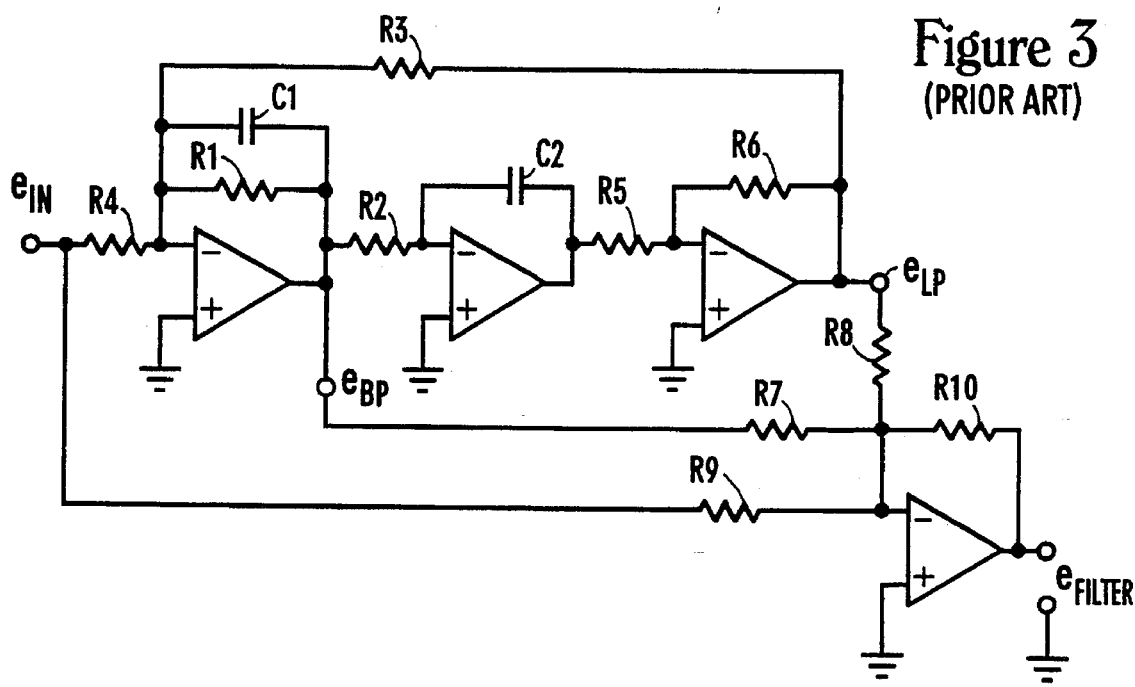
FIG. 3 is a schematic of a prior art filter which might be used in an in-phase and a quadrature path of a prior art modulator.
Figure 4:
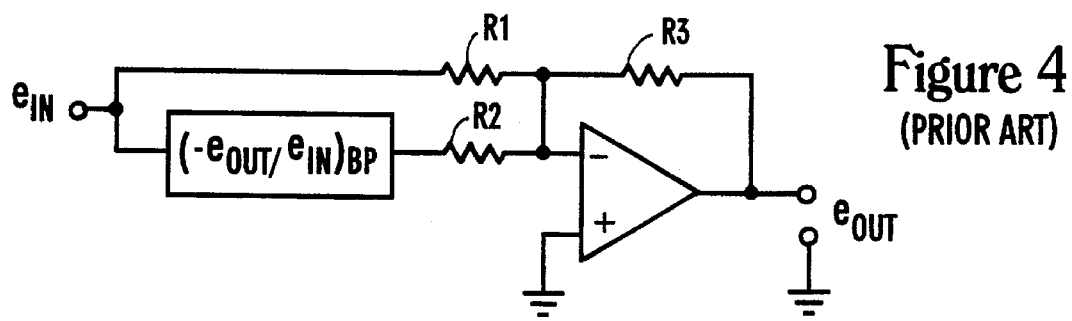
FIG. 4 is a schematic of another prior art filter which might be used in an in-phase and a quadrature path of a prior art modulator.
Figure 5:
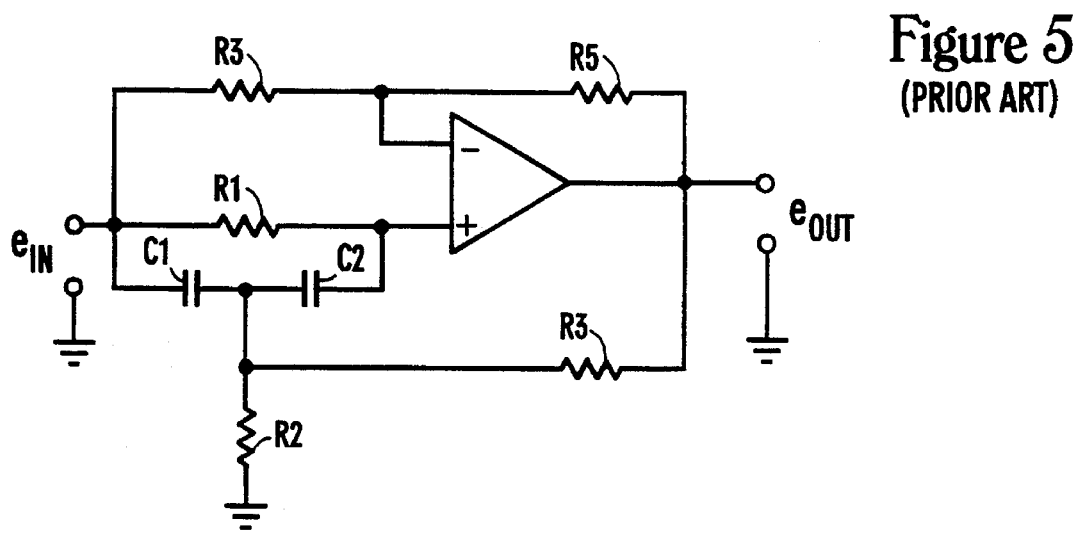
FIG. 5 is a schematic of yet another prior art filter which might be used in an in-phase and a quadrature path of a prior art modulator.
Figure 6:
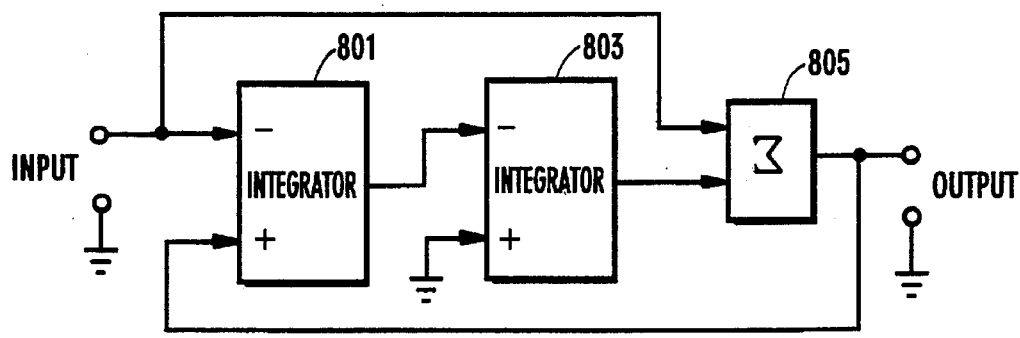
FIG. 6 is a block diagram of a low pass filter having a notch, in which the gain of the filter is independent of the values or characteristics of any of the components used to form the filter, in accordance with the present invention.

FIG. 6 is a block diagram of a two pole filter 800 having a notch used in accordance with one embodiment of the present invention. The filter 800 comprises a first integrator 801 having a differential input, a second integrator 803 having a differential input, and a summing circuit 805. In accordance with one embodiment of the present invention, for signals applied to the negative input while the second input is held at ground, the first integrator has a transfer function which is:

$$-1/(S \cdot \tau_1) = N_1 \qquad \text{EQ. 1}$$

where $\tau_1$ is a constant; $S=j\omega$; j is the complex number $-1^{1/2}$; and $\omega$ is frequency in radians/sec. The transfer function for signals which are applied to the second input with the first input held at ground, the transfer function is equal to:

$$1 + 1/(S \cdot \tau_1) = N_3 \qquad \text{EQ. 2}$$

The second integrator has the transfer function:

$$-1/(S \cdot \tau_2) = N_2 \qquad \text{EQ. 3}$$

where $\tau_2$ is a constant.

In accordance with the present invention, an input signal is coupled to both the negative input to the first integrator 801 and to the first of two inputs to the summing circuit 805. The output from the first integrator 801 is coupled to the negative input to the second integrator 803. The output from the second integrator is coupled to the second input to the summing circuit 805. The output from the summing circuit 805 is coupled to the positive input to the integrator 801. The transfer function for this circuit can be derived using superposition as follows:

(1) Note that there are three paths to the output:
  (a) the first of these paths is from the input through the first input to the summing circuit 805;
  (b) the second of these paths is from the input through the negative input of the first integrator 801, through the negative input of the second integrator 803, and through the second input of the summing circuit 805;
  (c) the third of these paths is the feedback path from the positive input of the first integrator 801, through the negative input of the second integrator 803, and through the second input of the summing circuit 805.

(2) Summing the transfer function of each of the three independent paths as follows:
First path: $V_{in} \cdot \alpha_1$
Second path: $V_{in} \cdot N_1 \cdot N_2 \cdot \alpha_2$
Third path: $V_{out} \cdot N_3 \cdot N_2 \cdot \alpha_2$
Sum of the three paths = $V_{out} = V_{in} \cdot \alpha_1 + V_{in} \cdot N_1 \cdot N_2 \cdot \alpha_2 + V_{out} \cdot N_3 \cdot N_2 \cdot \alpha_2$ (3) By solving for $V_{out}/V_{in}$ the transfer function of the entire circuit shown in FIG. 6 is derived:

$$V_{out}(1 + N_3 \cdot N_2 \cdot \alpha_2) = V_{in} \cdot \alpha_1 + V_{in} \cdot N_1 \cdot N_2 \alpha_2$$

$$V_{out}/V_{in} = [\alpha_1 + N_1 \cdot N_2 \cdot \alpha_2]/[1 - N_3 \cdot N_2 \cdot \alpha_2] \qquad \text{EQ. 4}$$

(4) Substituting back the values of $N_1$, $N_2$, and $N_3$ from EQ. 1–3:

$$V_{out}/V_{in} = [\alpha_1 + \{1/(S \cdot \tau_1)\} \cdot \{1/(S \cdot \tau_2)\} \cdot \alpha_2]/[1 + \{1/(S \cdot \tau_2)\} \cdot \{1 + 1/(S \cdot \tau_1)\} \alpha_2]$$

(5) Multiplying the entire equation by $(S^2 \cdot \tau_1 \cdot \tau_2)$ results in:

$$V_{out}/V_{in} = [(\alpha_1 \cdot S^2 \cdot \tau_1 \cdot \tau_2) + \alpha_2]/[(S^2 \cdot \tau_1 \cdot \tau_2) + (S \cdot \tau_1) + \alpha_2]$$

(6) Finally, by dividing both the numerator and denominator by $\alpha_2$ the following transfer function is derived:

$$V_{out}/V_{in} = [(\{\alpha_1/\alpha_2\} \cdot S^2 \cdot \tau_1 \cdot \tau_2) + 1]/[(S^2 \cdot \tau_1 \cdot \tau_2)/\alpha_2 + (S \cdot \tau_1) + 1] \qquad \text{EQ. 5}$$

It can be seen from this transfer function that the gain is 1 and does not depend upon the value or characteristics of any of the components of the filter. That is, comparing this transfer function to the generalized form:

$$T(s) = V_{out}/V_{in} = K \cdot [(a \cdot S^2) + 1]/[b \cdot S^2 + c \cdot S + 1]$$

where K is the gain of the filter having two imaginary zeros, it is clear that in the case of the transfer function shown in equation EQ. 5, in which $a = (\{\alpha_1/\alpha_2\} \cdot \tau_1 \cdot \tau_2)$; $b = (\tau_1 \cdot \tau_2)/\alpha_2$; and $c = \tau_1$; that K=1 and is independent of the values or characteristics of any of the components used in the filter. Therefore, two such filters will have the same exact gain.

Figure 7:
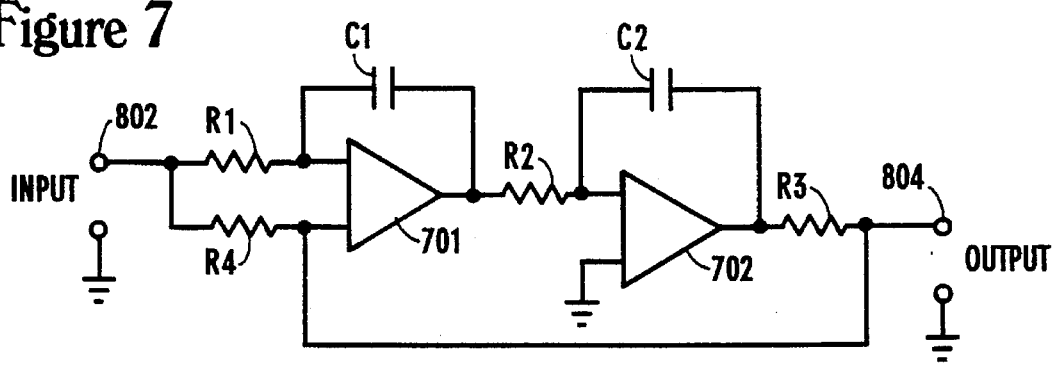
FIG. 7 is a schematic of the one embodiment of low pass filters which have a notch and which have a gain that is independent of the values or characteristics of any of the components used to form the filter, in accordance with the present invention.

FIG. 7 is a schematic of one particular embodiment of the filter shown in FIG. 6. As shown in FIG. 7, a first integrator is formed by the combination of an operational amplifier 701, a resistor $R_1$, and a capacitor $C_1$. A second integrator is formed by the combination of a second operational amplifier 703, a second resistor $R_2$, and a second capacitor $C_2$. A summing circuit is formed by a third and fourth resistors $R_3$, $R_4$. It will be understood by those skilled in the art that the circuit shown may be modified by adding series resistances and/or shunt capacitances without altering the transfer function of the circuit. It can be seen by one skilled in the art that the transfer function through the negative input of the first integrator of FIG. 7 is:

$$-1/(S \cdot C_1 \cdot R_1) = N_1 \qquad \text{EQ. 6;}$$

the transfer function through the negative input of the second integrator is:

$$-1/(S \cdot C_2 \cdot R_2) = N_2 \qquad \text{EQ. 7;}$$

the transfer function through the positive input of the first integrator is:

$$1 + [1/(S \cdot C_1 \cdot R_1)] = N_3 \qquad \text{EQ. 8;}$$

the transfer function through the summing circuit from the circuit input 802 to the circuit output 804 is:

$$R_3/(R_3 + R_4) = \alpha_1 \qquad \text{EQ. 9; and}$$

the transfer function from the output of the second integrator to the circuit output 804 is:

$$R_4/(R_3 + R_4) = \alpha_2 \qquad \text{EQ. 10.}$$

Substituting the values of $N_1$–$N_3$ from equations EQ. 6–EQ 8 into equations EQ. 1–EQ. 3, and solving for $\tau_1$ and $\tau_2$ results in:

$$\tau_1 = R_1 \cdot C_1 \text{ and } \tau_2 = R_2 \cdot C_2 \qquad \text{EQ. 11}$$

Accordingly, substituting equation EQs. 9–11 into equation EQ. 5, results in the transfer function:

$$V_{out}/V_{in} = [(\{R_1 \cdot R_2 \cdot R_3/R_4\} \cdot C_1 \cdot C_2 \cdot S^2) + 1]/[(S^2 \cdot R_1 \cdot R_2 \cdot C_1 C_2) \cdot \{(R_3 + R_4)/R_4\} + (S \cdot R_1 \cdot C_1) + 1] \qquad \text{EQ. 12}$$

As was the case in the example illustrated with regard to the block diagram of FIG. 6, the gain of the filter shown in FIG. 7 is 1 and is independent of the values and characteristics of any of the components used in the filter. Therefore, even though the shape of the filter will depend upon the elements $R_1$, $R_2$, $C_1$, $C_2$, the gain of the filter will be independent of these elements and will be identical to each other such filter.

Figure 8:
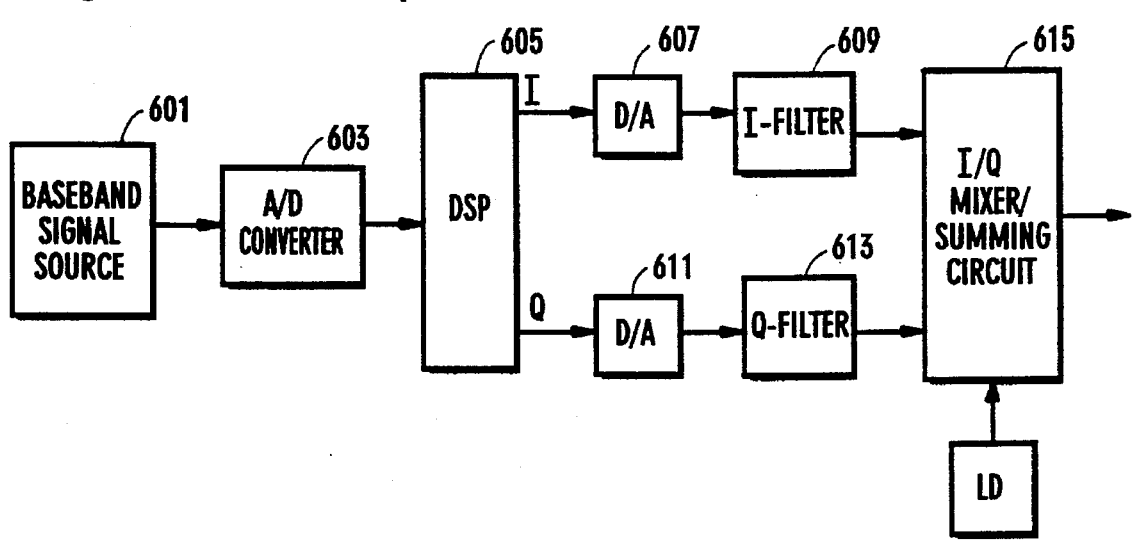
FIG. 8 is a block diagram of a modulator in accordance with the present invention.

FIG. 8 is a block diagram of a modulator 600 in accordance with one embodiment of the present invention in which the modulator 600 is being used in a radio transmitter. As shown in FIG. 8, the modulator 600 is preferably coupled to an input source 601 which provides the information to be digitized by an analog to digital (A/D) converter 603 and encoded by a signal processor, such as a digital signal processor (DSP) 605. The DSP 605 is preferably a single integrated circuit which may be purchased or designed as an application specific integrated circuit (ASIC). In either case, the DSP 605 generates an in-phase (I) and a quadrature (Q) component. The inphase component is of the form Cos φ(t); where φ(t) is the input signal supplied from the baseband signal source 601. The in-phase component is coupled to an digital-to analog (D/A) converter 607. The D/A converter 607 places the in-phase component back in analog form. The in-phase component is then coupled to an in-phase component filter 609 (referred to hereinafter as an "I" filter). Likewise, the quadrature component is of the form Sin φ(t) and is coupled to a D/A converter 611 and then to a quadrature component filter 613 (referred to hereinafter as a "Q" filter). Generation of such in-phase and quadrature components is well known. It should be understood by those skilled in the art that alternative methods may be used to generate the in-phase and quadrature components.

The heart of the present invention lies in the fact that the I and Q filters 609, 613 are matched to one another (as described above), such that the gain of each filter is equal to 1, independent of the value or characteristics of the components used in the filter. By matching the gain of the I and Q filters 609, 613, the relative amplitude of the I and Q components will be undistorted by the application of each component to a physically different filter. In particular, it is important that the gain of the filters be closely matched in order to reduce distortion which would result in errors upon demodulation of the information at the receiving end of the communication path. It is well known that I and Q filters 609, 613 having a notch are required in order to reduce the quantization noise which results from the conversion of the signal between analog and digital form by the A/D 603 and the D/As 607, 611.

The outputs from each of the filters 609, 613 are coupled to two inputs of an I and Q Mixer Summing Circuit 615, such as the I/Q Modulator integrated circuit part number U2790B Distributed by Temic. The I and Q Mixer Summing Circuit 615 performs the function of multiplying the in-phase component with a local oscillator signal coupled to an LO input port. The quadrature component is preferably multiplied with a Signal that lags the signal with which the in-phase component is mixed by 90°. In the preferred embodiment of the present invention, the LO signal has the form Cos ω(t). Therefore, the in-phase component is multiplied by the signal Cos ω(t) and the quadrature component is multiplied by a signal of the form −Sin ω(t). These two products are then summed to form a signal which is of the form:

$$A \cos \phi(t) \cos \omega_0 t - A \sin \phi(t) \sin \omega_0 t = A \cos [\omega_0 t + \phi(t)]$$

It will be clear to those skilled in the art that the output from the I and Q Mixer Summing Circuit 615 is the input signal provided by the baseband signal source 601, frequency modulated onto a carrier which is provided to the LO input of the I and Q Mixer Summing Circuit 615.

A number of embodiments of the present invention have been described. Nevertheless, it will be understood that various modifications may be made without departing from the spirit and scope of the invention. For example, while the matched filters of the present invention are described primarily in the context of a modulation scheme and a modulator, it will be understood by those skilled in the art that the matched filters of the present invention may be used in any system which the gain of the two filters must be very nearly identical. For example, the matched filters of the present invention may be used in a system in which two signals are offset from one another by a delay or by a difference in phase angle which is more or less than 90°. Furthermore, it will be clear to one skilled in the art that the filters of the present invention may be constructed in numerous ways with numerous variations on the circuit and components included therein. For example, one embodiment of the present invention is shown as an active circuit having operational amplifiers which provide the integration function required. However, the integration function may alternatively be provided by a passive circuit. Accordingly, it is to be understood that the invention is not to be limited by the specific illustrated embodiment, but only by the scope of the appended claims.

I claim:

1. A circuit for processing related signal components, adapted to be coupled to a signal source which provides at least two related signal components, including:

(a) a first low pass filter, having two imaginary zeros, adapted to be coupled to the signal source for receiving from the signal source the first of the two related signal components, including:

(1) a first integrator having a positive input, a negative input, and an output;

(2) a second integrator having at least a negative input and an output, the negative input of the second integrator being coupled to the output from the first integrator; and (3) a summing circuit having at least two inputs and an output, the first input being coupled to the negative input to the first integrator, the second input being coupled to the output from the second integrator, and the output being coupled to the positive input to the first integrator; and (b) at least a second low pass filter, having two imaginary zeros, adapted to be coupled to the signal source for receiving from the signal source the second of the two related signal components;

(1) a first integrator having a positive input, a negative input, and an output;

(2) a second integrator having at least a negative input and an output, the negative input of the second integrator being coupled to the output from the first integrator; and (3) a summing circuit having at least two inputs and an output, the first input being coupled to the negative input to the first integrator, the second input being coupled to the output from the second integrator, and the output being coupled to the positive input to the first integrator.

2. The circuit of claim 1, wherein at least one of the integrators includes:

(a) an operational amplifier having an inverting and a non-inverting input and an output, (b) a capacitor coupled between the inverting input and the output; and (c) a resistor coupled to the inverting input.

3. The circuit of claim 1, wherein each of the integrators includes:
   (a) an operational amplifier having an inverting and a non-inverting input and an output,
   (b) a capacitor coupled between the inverting input and the output; and
   (c) a resistor coupled to the inverting input.

4. The circuit of claim 3, where in each summing circuit includes a first and a second resistor, the first resistor being coupled between a node at the first input and a node at the output of the summing circuit, and the second resistor being coupled between the a node at the second input and the node at the output of the summing circuit.

5. The circuit of claim 1, wherein the characteristic transfer function of the circuit is equal to $T(s)=K_1 \cdot [(a \cdot S^2)+1]/K_2 \cdot [b \cdot S^2+c \cdot S+1]$; where $K_1=K_2$, and $K_1$, $K_2$, a, b, and c are constants, $S=j\omega$, $\omega$=frequency in radians per second, and $j=1^{-\frac{1}{2}}$.

6. The circuit of claim 4, wherein the characteristic transfer function of the circuit is equal to $T(s)=[(\{R_1 \cdot R_2 \cdot R_3/R_4\} \cdot S^2)+1]/[(S^2 \cdot R_1 \cdot R_2 \cdot C_1 \cdot C_2) \cdot \{(R_3+R_4)/R_3\}+(S \cdot R_1 \cdot C_1)+1]$, where $R_1$ is the value of the resistor in the first integrator, $R_2$ is the value of the resistor in the second integrator, $C_1$ is the capacitance of the capacitor in the first integrator, $C_2$ is the capacitance of the capacitor in the second integrator, $R_3$ is the value of the first resistor in the summing circuit, and $R_4$ is the value of the second resistor in the summing circuit.

7. A modulator including:
   (a) an analog to digital converter, having an output and an input, the input being configured to be coupled to a signal source;
   (b) a digital signal processor for generating an in-phase and a quadrature signal component, the digital signal processor having an input and a first and a second output, the input being coupled to the analog digital converter;
   (c) a first digital-to-analog converter, having an input and an output, the input being coupled to first output from the digital signal processor for receiving the in-phase signal component;
   (d) a second digital-to-analog converter having an input and an output, the input being coupled to the second output from the digital signal processor for receiving the quadrature signal component;
   (e) a first low pass filter, having two imaginary zeros, including:
      (1) a first integrator having a positive input, a negative input, and an output;
      (2) a second integrator having at least a negative input and an output, the negative input of the second integrator being coupled to the output from the first integrator; and
      (3) a summing circuit having at least two inputs and an output, the first input being coupled to the negative input to the first integrator, the second input being coupled to the output from the second integrator, and the output being coupled to the positive input to the first integrator; and
   (f) a second low pass filter, having two imaginary zeros, coupled to the at least one source for receiving from the source the second of the two related signal components;
      (1) a first integrator having a positive input, a negative input, and an output;
      (2) a second integrator having at least a negative input and an output, the negative input of the second integrator being coupled to the output from the first integrator; and
      (3) a summing circuit having at least two inputs and an output, the first input being coupled to the negative input to the first integrator, the second input being coupled to the output from the second integrator, and the output being coupled to the positive input to the first integrator;
   (g) an I and Q mixer summing circuit having a first, second, and third input and an output, the first input being coupled to the output of the summing circuit of the first low pass filter, and the second input being coupled to the output of the summing circuit of the second low pass filter; and
   (h) a local oscillator source coupled to the third input of the I and Q mixer summing circuit.

8. The circuit of claim 7, wherein at least one of the integrators includes:
   (a) an operational amplifier having an inverting and a non-inverting input and an output,
   (b) a capacitor coupled between the inverting input and the output; and
   (c) a resistor coupled to the inverting input.

9. The circuit of claim 7, wherein each of the integrators includes:
   (a) an operational amplifier having an inverting and a non-inverting input and an output,
   (b) a capacitor coupled between the inverting input and the output; and
   (c) a resistor coupled to the inverting input.

10. The circuit of claim 9, where in each summing circuit includes a first and a second resistor, the first resistor being coupled between a node at the first input and a node at the output of the summing circuit, and the second resistor being coupled between a node at the second input and the node at the output of the summing circuit.

11. The circuit of claim 7, wherein the characteristic transfer function of the circuit is equal to $T(s)=K_1 \cdot [(a \cdot S^2)+1]/K_2 \cdot [b \cdot S^2+c \cdot S+1]$; where $K_1=K_2$, and $K_1$, $K_2$, a, b, and c are constants, $S=j\omega$, $\omega$=frequency in radians per second, and $j=1^{-\frac{1}{2}}$.

12. The circuit of claim 10, wherein the characteristic transfer function of the circuit is equal to $T(s)=[(\{R_1 \cdot R_2 \cdot R_3/R_4\} \cdot S^2)+1]/[(S^2 \cdot R_1 \cdot R_2 \cdot C_1 \cdot C_2) \cdot \{(R_3+R_4)/R_3\}+(S \cdot R_1 \cdot C_1)+1]$, where $R_1$ is the value of the resistor in the first integrator, $R_2$ is the value of the resistor in the second integrator, $C_1$ is the capacitance of the capacitor in the first integrator, $C_2$ is the capacitance of the capacitor in the second integrator, $R_3$ is the value of the first resistor in the summing circuit, and $R_4$ is the value of the second resistor in the summing circuit.

* * * * *